United States Patent [19]

Nawata et al.

[11] Patent Number: 4,636,534
[45] Date of Patent: Jan. 13, 1987

[54] PHOTOPOLYMERIZABLE COMPOSITION

[75] Inventors: Kazuyoshi Nawata, Onoda; Masahito Katayama; Minoru Yokoshima, both of Yamaguchi, all of Japan

[73] Assignee: Nippon Kayaku Kabushiki Kaisha, Tokyo, Japan

[21] Appl. No.: 792,736

[22] Filed: Oct. 29, 1985

[30] Foreign Application Priority Data

Oct. 30, 1984 [JP]  Japan ................. 59-226928

[51] Int. Cl.$^4$ ............... C08F 2/50; C08F 271/02; C08F 220/40
[52] U.S. Cl. ........................... 522/116; 522/44; 522/182; 525/279
[58] Field of Search .................... 522/116, 120

[56] References Cited

U.S. PATENT DOCUMENTS

| | | | |
|---|---|---|---|
| 3,953,214 | 4/1976 | Lipson | 522/142 |
| 4,293,636 | 10/1981 | Okuya | 522/107 |
| 4,514,271 | 4/1985 | Williams | 522/83 |
| 4,588,664 | 5/1986 | Fielding | 522/25 |

FOREIGN PATENT DOCUMENTS

| | | |
|---|---|---|
| 149040 | 9/1983 | Japan . |
| 153930 | 9/1983 | Japan . |
| 29246 | 2/1984 | Japan . |
| 26065 | 2/1985 | Japan . |

*Primary Examiner*—Lewis T. Jacobs
*Assistant Examiner*—Arthur H. Koeckert
*Attorney, Agent, or Firm*—Cushman, Darby & Cushman

[57] ABSTRACT

Disclosed herein is a photopolymerizable composition comprising poly-N-vinylpyrrolidone (A); a compound (B) represented by the formula (I):

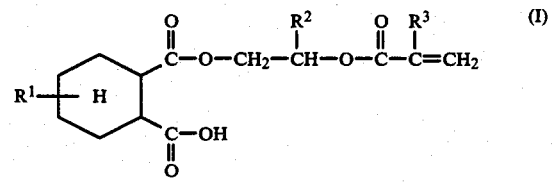

wherein each of $R^1$, $R^2$ and $R^3$ represents a hydrogen atom or a methyl group; an acid amide (C) represented by the formula (II):

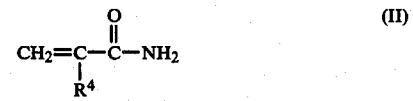

wherein $R^4$ represents a hydrogen atom or a methyl group and a monomeric compound (D) having an acryloyl group or a methacryloyl group in the molecule thereof as well as optionally a photopolymerization-initiator (E).

8 Claims, No Drawings

PHOTOPOLYMERIZABLE COMPOSITION

BACKGROUND OF THE INVENTION

The present invention relates to a photopolymerizable composition which is curable by irradiation of ultraviolet rays and more in detail, relates to a novel photopolymerizable composition particularly suitable as an etching-resist ink for the production of a printed-circuit board.

As the etching-resist ink of an ultraviolet curing type, a composition containing polyester, hydroxyalkyl acrylate, a photopolymerizable monomer, a carboxylic acid having 2 to 36 carbon atoms and a photopolymerization-initiator (refer to Japanese Patent Application Laid-Open No. 51-2503 (1976) U.S. Pat. No. 3,953,214,) and a composition containing polyester, half ester of hydroxy alkyl acrylate and polybasic acid, a vinyl monomer having an ethylenic unsaturated bond and a photopolymerization-initiator, (refer to Japanese Patent Application Laid-Open No. 57-13444 (1982) U.S. Pat. No. 4,293,636) have been known.

However, the techniques have a demerit that in the case of removing the resist-film by an aqueous alkaline solution, the resist-film is swollen and exfoliated without being dissolved and accordingly, the thus swollen and exfoliated film causes blockade of the filter or the spouting nozzle for the aqueous alkaline solution.

As a result of the present inventors' studies for solving the above-mentioned problem, the present inventors have found a photopolymerizable composition suitable for preparing an etching-resist ink which is curable by irradiation of ultraviolet rays and in which the thus cured etching-resist ink is soluble in an aqueous alkaline solution, and based on the finding, the present invention has been attained.

SUMMARY OF THE INVENTION

In an aspect of the present invention, there is provided a photopolymerizable composition comprising poly-N-vinylpyrrolidone (A), a compound (B) represented by the formula (I):

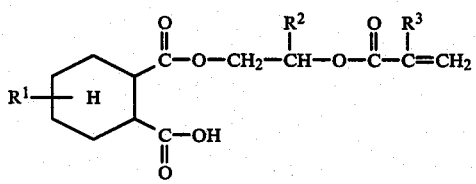

wherein each of $R^1$, $R^2$ and $R^3$ represents a hydrogen atom or a methyl group, an acid amide (C) represented by the formula (II):

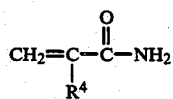

wherein $R^4$ represents a hydrogen atom or a methyl group and a monomeric compound (D) having an acryloyl group or a methacryloyl group in the molecule thereof as well as optionally a photopolymerization-initiator (E).

DETAILED EXPLANATION OF THE INVENTION

The present invention relates to a photopolymerizable composition comprising poly-N-vinylpyrrolidone (A); a compound (B) represented by the formula (I):

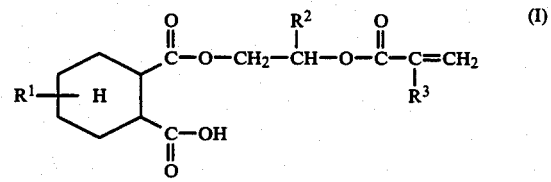

wherein each of $R^1$, $R^2$ and $R^3$ represents a hydrogen atom or a methyl group; an acid amide (C) represented by the formula (II):

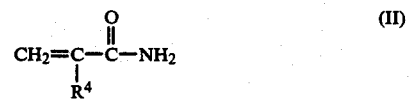

wherein $R^4$ represents a hydrogen atom or a methyl group and a monomer (D) having an acryloyl group or a methacryloyl group in the molecule thereof, as well as optionally a photopolymerization-initiator (E). The photopolymerizable composition according to the present invention is curable by irradiation of ultraviolet rays thereby obtaining the cured material thereof excellent in hardness and acid-resistance, the thus cured material being soluble in an aqueous alkaline solution.

The photopolymerizable composition according to the present invention is not only utilizable as the etching-resist ink for producing the printed-circuit board but also utilizable in any field where, after having accomplished the function thereof as a cured film, the cured film is to be removed by utilizing the specific property thereof that the cured film is acid-resistant and is soluble in an aqueous alkaline solution. Also, the photopolymerizable composition according to the present invention may be used as a plating resist. Furthermore, it may be used in the general coating field.

Poly-N-vinylpyrrolidone (A) as a binder polymer usable according to the present invention is preferably that of a molecular weight of 10,000 to 1,000,000, and particularly, that of a molecular weight of 20,000 to 900,000 is more preferable. For instance, those commercialized under the registered trade names of Luviskol K-30 and K-90 by BASF Co. may be mentioned.

The compound (B) used according to the present invention and represented by the formula (I) is available as the product of an equimolecular reaction between hexahydrophthalic anhydride or methylhexahydrophthalic anhydride and 2-hydroxyalkyl acrylate or 2-hydroxyalkyl methacrylate. As the 2-hydroxyalkyl acrylate or 2-hydroxyalkyl methacrylate, 2-hydroxyethyl acrylate, 2-hydroxyethyl methacrylate, 2-hydroxypropyl methacrylate and the like may be exemplified. Examples of synthesizing the compound (B) represented by the formula (I) are shown as follows.

SYNTHETIC EXAMPLE 1

Synthesis of the compound (B) No. 1

In a 1.0-liter flask provided with a stirring device, a thermometer and a condenser, 154.18 parts by weight of hexahydrophthalic anhydride, 121.8 parts by weight of 2-hydroxyethyl acrylate and 0.138 part by weight of hydroquinone monomethyl ether as a polymerization-inhibitor were introduced at a time, and the mixture was gently stirred until solid hexahydrophthalic anhydride was dissolved while slowly heating the mixture. After finding the complete dissolution of hexahydrophthalic anhydride, the reaction was continued while maintaining the temperature of the mixture at 90°±5° C. After continuing the reaction for 19 hours, the half ester of the formula (I) wherein each of $R^1$, $R^2$ and $R^3$ is a hydrogen atom, having the following properties was obtained.

Acid value (mgKOH/g): 201.0.
Viscosity (cps, at 25° C.): 3350.0.
Specific gravity (at 25° C.): 1.197.

SYNTHETIC EXAMPLE 2

Synthesis of the compound (B) No. 2

In a 1-liter flask provided with the same devices as in SYNTHTIC EXAMPLE 1, 154.18 parts by weight of hexahydrophthalic anhydride, 136.7 parts by weight of 2-hydroxyethyl methacrylate and 0.145 part by weight of hydroquinone monomethyl ether as a polymerization-inhibitor were put at a time, and the mixture was reacted as in SYNTHETIC EXAMPLE 1 to form a half ester of the formula (I) wherein each of $R^1$ and $R^2$ is a hydrogen atom and $R^3$ is a methyl group, having the following properties.

Acid value (mgKOH/g): 193.0.
Viscosity (cps, at 35° C.): 950.
Specific gravity (at 35° C.): 1.165.

SYNTHETIC EXAMPLE 3

Synthesis of the compound (B) No. 3

In a 1-liter flask provided with the same devices as in SYNTHETIC EXAMPLE 1, 168 parts by weight of 4-methylhexahydrophthalic anhydride, 121.8 parts by weight of 2-hydroxyethyl acrylate and 0.137 part by weight of hydroquinone monomethyl ether as a polymerization-inhibitor were introduced at a time, and the mixture was reacted as in SYNTHETIC EXAMPLE 1 to form the half ester of the formula (I) wherein $R^1$ is a 4-methyl group and both of $R^2$ and $R^3$ are hydrogen atoms, having the following properties.

Acid value (mgKOH/g): 202.0.
Viscosity (cps, at 25° C.): 4800.
Specific gravity (at 25° C.): 1.1700.

As the acid amide (C) represented by the formula (II), acrylamide and methacrylamide are mentioned.

As the monomer (D) having an acryloyl group or a methacryloyl group in the molecule thereof, various esters of acrylic acid and methacrylic acid may be mentioned. For instance, carbitol acrylate, carbitol methacrylate, tetrahydrofurfuryl acrylate, tetrahydrofurfuryl methacrylate, 2-hydroxyethyl acrylate, 2-hydroxyethyl methacrylate, 2-hydroxypropyl acrylate, 2-hydroxypropyl methacrylate, methyl acrylate, methyl methacrylate, ethyl acrylate, ethyl methacrylate, propyl acrylate, propyl methacrylate, butyl acrylate, butyl methacrylate, 2-ethylhexyl acrylate, 2-ethylhexyl methacrylate, phenoxyethyl acrylate, phenoxyethyl methacrylate and the like may be exemplified. Each of the above-mentioned monomers may be used singly or in combination thereof as a mixture. As the particularly preferable monomer (D), carbitol acrylate, carbitol methacrylate, 2-hydroxypropyl methacrylate, 2-hydroxyethyl acrylate, 2-hydroxyethyl methacrylate and phenoxyethyl methacrylate may be mentioned.

As the photopolymerization-initiator (E) according to the present invention, any one of the known photopolymerization-initiators of diacetyl, benzoin, acyloins, ethers, aromatic ketones and aromatic aldehydes, etc. may be mentioned.

As a suitable photopolymerization-initiator (E), for instance, benzoin alkyl ethers such as benzoin ethyl ether, benzoin isobutyl ether, benzoin isopropyl ether and the like, acetophenones such as 2,2-diethoxyacetophenone, 4'-phenoxy-2,2-dichloroacetophenone and the like, propiophenones such as 2-hydroxy-2-methylpropiophenone, 4'-isopropyl-2-hydroxy-2-methylpropiophenone, 4'-dodecyl-2-hydroxy-2-methylpropiophenone and the like, anthraquinones such as 2-ethylanthraquinone, 2-chloroanthraquinone and the like, benzil dimethyl ketal, 1-hydroxycyclohexyl phenyl ketone and those of thioxanthones may be exemplified. Each of the above-mentioned photopolymerization-initiators may be used singly or in combination as a mixture.

In order to produce the photopolymerizable composition according to the present invention, in case of necessity, a polymerization-inhibitor, for instance, methoquinone, methylhydroquinone, etc.; a viscosity-raising agent, for instance, silica; a levelling agent, for instance, MODAFLOW®, FLORATE® and the like; a fluidity-improving agent; a frosting agent; plasticizers; fillers such as barium sulfate, calcium sulfate and the like; colouring agent(s) such as pigment(s) and dyestuff(s) and the other additives may be added.

The amount of each of the components (A) to (E) in the total amount of the components (A) to (E) of the composition according to the present invention is preferably in the range of from 0.5 to 20% by weight, from 55 to 85% by weight, from 5 to 20% by weight, from 5 to 20% by weight and from 0 to 10% by weight in the order. The photopolymerizable composition containing the amount of each of the components shown above is especially good for making inks, and the cured film made therefrom is dissolved quite easily in the aqueous alkaline solution. In the case where the component (E) is used, the amount thereof is preferably from 1 to 10% by weight of the total amount of components (A) to (E) of the composition. The particularly preferable amount of each of the components (A) to (E) is from 2 to 7% by weight, from 70 to 80% by weight, from 5 to 15% by weight, from 5 to 15% by weight and from 1 to 7% by weight in the order.

A photopolymerizable composition according to the present invention comprising poly-N-vinylpyrrolidone (A), a compound (B) represented by the formula (I):

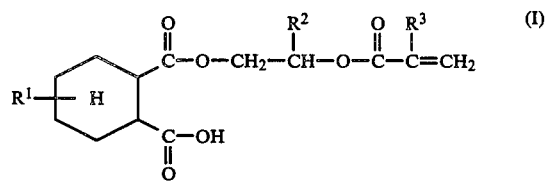

wherein each of $R^1$, $R^2$ and $R^3$ represents a hydrogen atom or a methyl group, an acid amide (C) represented by the formula (II):

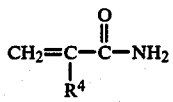

$$CH_2=C-C-NH_2 \quad (II)$$
$$\underset{R^4}{|}$$

wherein $R^4$ represents a hydrogen atom or a methyl group and a monomeric compound (D) having an acryloyl group or a methacryloyl group in the molecule thereof as well as optionally a photopolymerization-initiator (E) can be produced by uniformly mixing the components, preferably, 0.5 to 20% by weight of the poly-N-vinylpyrrolidone (A), 55 to 85% by weight of the compound (B) represented by the formula (I), 5 to 20% by weight of the acid amide (C) represented by the formula (II), 5 to 20% by weight of the monomeric compound (D) having an acryloyl group or a methacryloyl group in the molecule thereof, and 0 to 10% by weight of the photopolymerization-initiator (E), based on the total amount of the components (A) to (E).

In the case where the composition according to the present invention is used as the etching-resist ink, it may be used in the followings.

A copper-clad laminate is printed with a composition according to the present invention by using a screen, and then the printed composition is irradiated by ultraviolet rays (for instance, a 2-kw high pressure mercury lamp), thereby curing the thus printed composition. The thus treated laminate having a cured film is soaked into an etching liquid (for instance, an aqueous solution of hydrochloric acid containing cupric chloride), thereby removing the copper without being covered by the cured film. On washing the thus treated laminate having the cured film with an aqueous alkaline solution (for instance, an aqueous solution of sodium hydroxide), the cured film dissolves in the aqueous alkaline solution and is removed from the laminate. The pH of the aqueous alkaline solution is preferably in the range of 11 to 13.

The cured film prepared from the photopolymerizable composition according to the present invention is soluble in an aqueous alkaline solution and was excellent in hardness and acid-resistance thereof and accordingly, the composition according to the present invention is suitable as the etching-resist ink of the ultraviolet-curing type and can also be used as plating resist.

The present invention will be explained more in detail while referring to the non-limitative examples and comparative examples as follows.

EXAMPLE 1

After preparing a photopolymerizable composition comprising 4.0 parts by weight of a poly-N-vinylpyrrolidone (a molecular weight of 40,000, made by BASF Company under the trade name of Luviskol K-30) (component (A), a polymer for use as a binder), 24.8 parts by weight of a compound (B) synthesized in SYNTHETIC EXAMPLE 1, 24.0 parts by weight of another compound (B) synthesized in SYNTHETIC EXAMPLE 2, 6.6 parts by weight of methacrylamide (C) and 7.0 parts by weight of carbitol acrylate (D) according to the present invention, the composition was uniformly mixed with 3.8 parts by weight of benzil dimethyl ketal (E), 0.5 part by weight of cyanin blue, 0.9 part by weight of MODAFLOW ® (a levelling agent, made by Monsanto Co.) and 28.4 parts by weight of talc as a filler, and after sufficiently kneading the mixture by a kneading machine provided with three rollers (made by INOUE Works Co., Ltd.), the thus prepared material was printed onto a copper foil on the base plate for printed-circuit board according to the screen-printing method while using a screen with a pattern having each five bands of 0.1 mm, 0.15 mm, 0.2 mm, 0.3 mm, 0.8 mm and 1.0 mm in width. By irradiating the thus printed plate with ultraviolet rays from a 2-kw mercury lamp, a specimen having the coating film of 4H in hardness (of a pencil) was obtained. On treating the thus obtained specimen with an etching liquid (an aqueous solution of hydrochloric acid containing cupric chloride) at 50° C. for 30 min, no abnormal finding was observed on the state of the coating film with the width in the range of 0.1 to 1.0 mm.

On treating the cured film with an aqueous 5% solution of sodium hydroxide, the cured film was dissolved therein within 18 sec.

EXAMPLE 2

After uniformly mixing the composition according to the present invention of 2.96% by weight of poly-N-vinylpyrrolidone (a molecular weight of 4000, made by BASF Company under the trade name of Luviskol K-30) (component (A), as the polymer for binder), 10.58% by weight of the compound (B) synthesized in SYNTHETIC EXAMPLE 2, 39.53% by weight of another compound (B) synthesized in SYNTHETIC EXAMPLE 3, 6.92% by weight of methacrylamide (C), 4.94% by weight of 2-hydroxypropyl methacrylate (D), 3.95% by weight of benzil dimethyl ketal (E), 0.5% by weight of an organic pigment (cyanin blue), 0.99% by weight of MODAFLOW ® and 29.64% by weight of talc, the thus mixed composition was printed onto a copper foil on the base plate for printed-circuit board in the same manner as in EXAMPLE 1 and the thus printed plate was treated in the same manner as in EXAMPLE 1 to obtain a specimen having a cured film of 3H in pencil-hardness.

On treating the thus obtained specimen with an etching liquid (an aqueous solution of hydrochloric acid containing cupric chloride) at 50° C. for 30 min, the state of the coating film of 0.1 to 1.0 mm in width was maintained without any abnormal findings. On treating the thus cured film with an aqueous 5% solution of sodium hydroxide, the film was dissolved in the solution within 21 sec.

EXAMPLE 3

A composition of the same components and the same amount of the components as in EXAMPLE 2 except for using acrylamide (C) instead of methacrylamide in EXAMPLE 2 was uniformly mixed and after subjecting the thus prepared composition to kneading, printing and curing in the same procedures as in EXAMPLE 1, a specimen having a cured film of 3H in pencil-hardness was obtained. On treating the thus obtained specimen with an etching liquid (an aqueous solution of hydrochloric acid containing cupric chloride) at 50° C. for 30 min, the state of the thus cured film of 0.1 to 1.0 mm in width did not show any abnormal findings. On treating the thus cured film with an aqueous 5% solution of sodium hydroxide, the film was dissolved therein within 26 sec.

EXAMPLE 4

After uniformly mixing a composition according to the present invention of 1.26% by weight of poly-N-vinylpyrrolidone (A) (a molecular weight of 700,000, made by BASF Company under the trade name of Luviskol K-90), 25.28% by weight of the compound (B) synthesized in SYNTHETIC EXAMPLE 1, 24.69% by weight of another compound (B) synthesized in SYNTHETIC EXAMPLE 2, 6.77% by weight of methacrylamide (C), 7.26% by weight of carbitol acrylate (D), 3.87% by weight of benzil dimethyl ketal (E), 0.5% by weight of cyanin blue, 0.97% by weight of MODAFLOW ® and 29.04% by weight of talc, the thus mixed composition was subjected to kneading, printing and curing as in EXAMPLE 1 to obtain a specimen having the cured film of 4H in pencil-hardness. On treating the thus obtained specimen with an etching liquid (an aqueous solution of hydrochloric acid containing cupric chloride) at 50° C. for 30 min, no abnormal finding was observed on the state of the cured film of 0.1 to 1.0 mm in width. On treating the cured film with an aqueous 5% solution of sodium hydroxide, at 50° C. the film was dissolved therein within 20 sec.

EXAMPLE 5

In the same manner as in EXAMPLE 1 except for using phenoxyethyl methacrylate instead of carbitol acrylate (D) in EXAMPLE 1, a specimen was obtained. The thus obtained specimen showed the same results as that of EXAMPLE 1.

COMPARATIVE EXAMPLE 1

Into a 1-liter three-necked flask provided with a stirrer, a thermometer and a separating funnel having a condenser, 80 g (1.05 mol) of propylene glycol, 25 g (0.15 mol) of isophthalic acid and 99 g (0.85 mol) of maleic anhydride were introduced, and by reacting the thus introduced material at a temperature in a range of 50° to 200° C. for 18 hours in a gaseous nitrogen atmosphere, polyester was obtained. After uniformly mixing a composition of 4.4% by weight of the thus obtained polyester of a softening point of 60.5° C. and acid value of 53, 25.61% by weight of the compound (B) synthesized in SYNTHETIC EXAMPLE 1, 24.88% by weight of another compound (B) synthesized in SYNTHETIC EXAMPLE 2, 7.32% by weight of carbitol acrylate, 2.93% by weight of 2-hydroxypropyl methacrylate, 3.90% by weight of benzil dimethyl ketal, 0.5% by weight of cyanin blue, 0.99% by weight of MODAFLOW ® and 29.27% by weight of talc, the thus mixed composition was subjected to kneading, printing and curing as in EXAMPLE 1 to obtain a specimen having the cured film of 3H in pencil-hardness. On treating the specimen in the same procedures as in Example 1, although the films treated with the etching liquid (an aqueous solution of hydrochloric acid containing cupric chloride) showed no abnormal state (films of the width of from 0.1 to 1.0 mm), the cured film was swollen on treating in an aqueous 5% solution of sodium hydroxide and then exfoliated from the specimen within 30 sec. The cured film was not dissolved in the aqueous alkaline solution.

What is claimed is:

1. A photopolymerizable composition comprising poly-N-vinylpyrrolidone (A), a compound (B) represented by the formula (I):

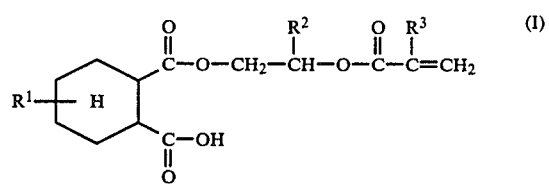

wherein each of $R^1$, $R^2$ and $R^3$ represents a hydrogen atom or a methyl group, an acid amide (C) represented by the formula (II):

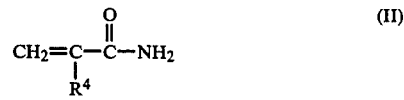

wherein $R^4$ represents a hydrogen atom or a methyl group and a monomeric compound (D) having an acryloyl group or a methacryloyl group in the molecule thereof selected from the group consisting of carbitol acrylate, carbitol methacrylate, 2-hydroxypropyl methacrylate, 2-hydroxyethyl acrylate, 2-hydroxyethyl methacrylate and phenoxyethyl methacrylate, as well as optionally a photopolymerization-initiator (E).

2. A photopolymerizable composition according to claim 1, wherein the amount of each of the components (A), (B), (C), (D) and (E) in the total amount of the components (A), (B), (C), (D) and (E) of said composition are 0.5 to 20% by weight, 55 to 85% by weight, 5 to 20% by weight, 5 to 20% by weight and 0 to 10% by weight, respectively.

3. A photopolymerizable composition according to claim 2, wherein the amount of the component (E) in the total amount of the components (A) to (E) of said composition is in a range of 1 to 10% by weight.

4. A photopolymerizable composition according to claim 1, 2 or 3, wherein the molecular weight of said poly-N-vinylpyrrolidone (A) is in a range of 10,000 to 1,000,000.

5. A photopolymerizable composition according to claim 1, 2 or 3, wherein said monomer (D) having an acryloyl group or a methacryloyl group in the molecule thereof further contains a compound selected from the group consisting of methyl acrylate, methyl methacrylate, ethyl acrylate, ethyl methacrylate, propyl acrylate, propyl methacrylate, butyl acrylate, butyl methacrylate, 2-ethylhexyl acrylate, 2-ethylhexyl methacrylate, phenoxyethyl acrylate and phenoxyethyl methacrylate.

6. A photopolymerizable composition according to claim 1, 2 or 3, for preparing an etching-resist ink.

7. A photopolymerizable composition according to claim 4 for preparing an etching-resist ink.

8. A photopolymerizable composition according to claim 5 for preparing an etching-resist ink.

* * * * *